United States Patent [19]

Lull

[11] 4,394,769
[45] Jul. 19, 1983

[54] DUAL MODULUS COUNTER HAVING NON-INVERTING FEEDBACK

[75] Inventor: John M. Lull, Fullerton, Calif.

[73] Assignee: Hughes Aircraft Company, El Segundo, Calif.

[21] Appl. No.: 274,005

[22] Filed: Jun. 15, 1981

[51] Int. Cl.³ .................. H03K 21/36; H03K 21/10; H03K 23/08

[52] U.S. Cl. ............................. 377/116; 377/114; 377/108; 377/121; 377/122

[58] Field of Search ............... 377/114, 115, 116, 108, 377/121, 122

[56] References Cited

U.S. PATENT DOCUMENTS 3,943,379  3/1976  McGuffin ........................ 377/116
4,224,574  9/1980  Shaw ............................... 377/114

Primary Examiner—John S. Heyman
Attorney, Agent, or Firm—R. M. Wallace; W. J. Bethurum; A. W. Karambelas

[57] ABSTRACT

The ring counter of this invention is self-initializing and is operable at a clock frequency corresponding to four gate delays and comprises a plurality of master of slave flip-flops, in which this high speed capability is attained by using non-inverting feedback between the first and last flip-flops and by operating the master and slave of each in complementary fashion without requiring the use of a complementary clock signal. The non-inverting feedback takes advantage of the inherent delay between the response of the complementary outputs of each flip-flop.

11 Claims, 31 Drawing Figures

Fig. 1a.
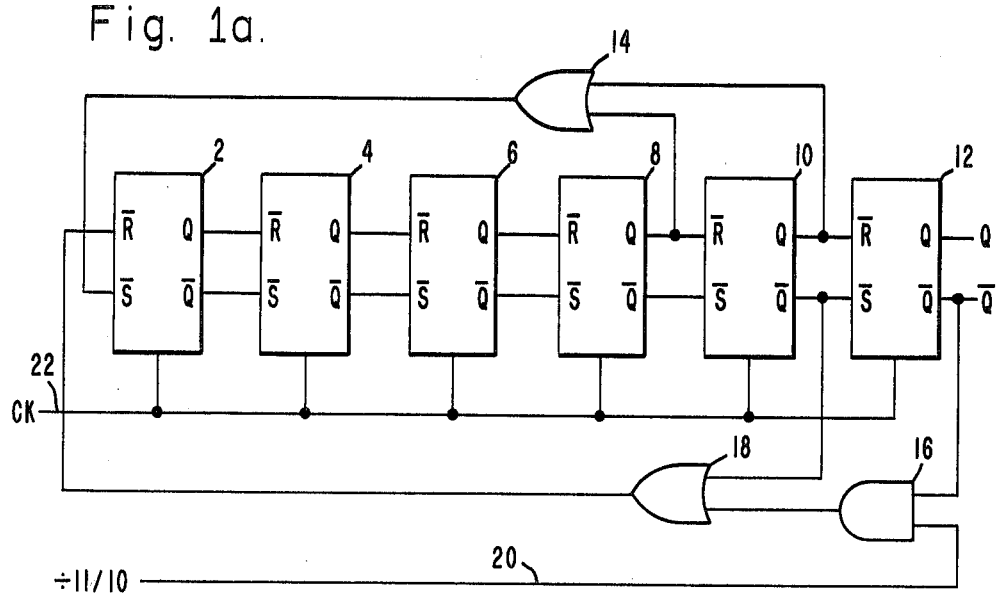
Fig. 1b.
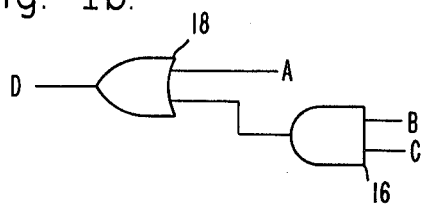
Fig. 1d.
Fig. 1c.
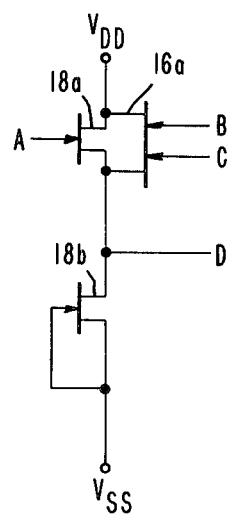
Fig. 1e.
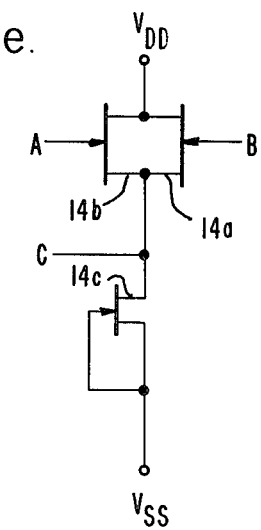

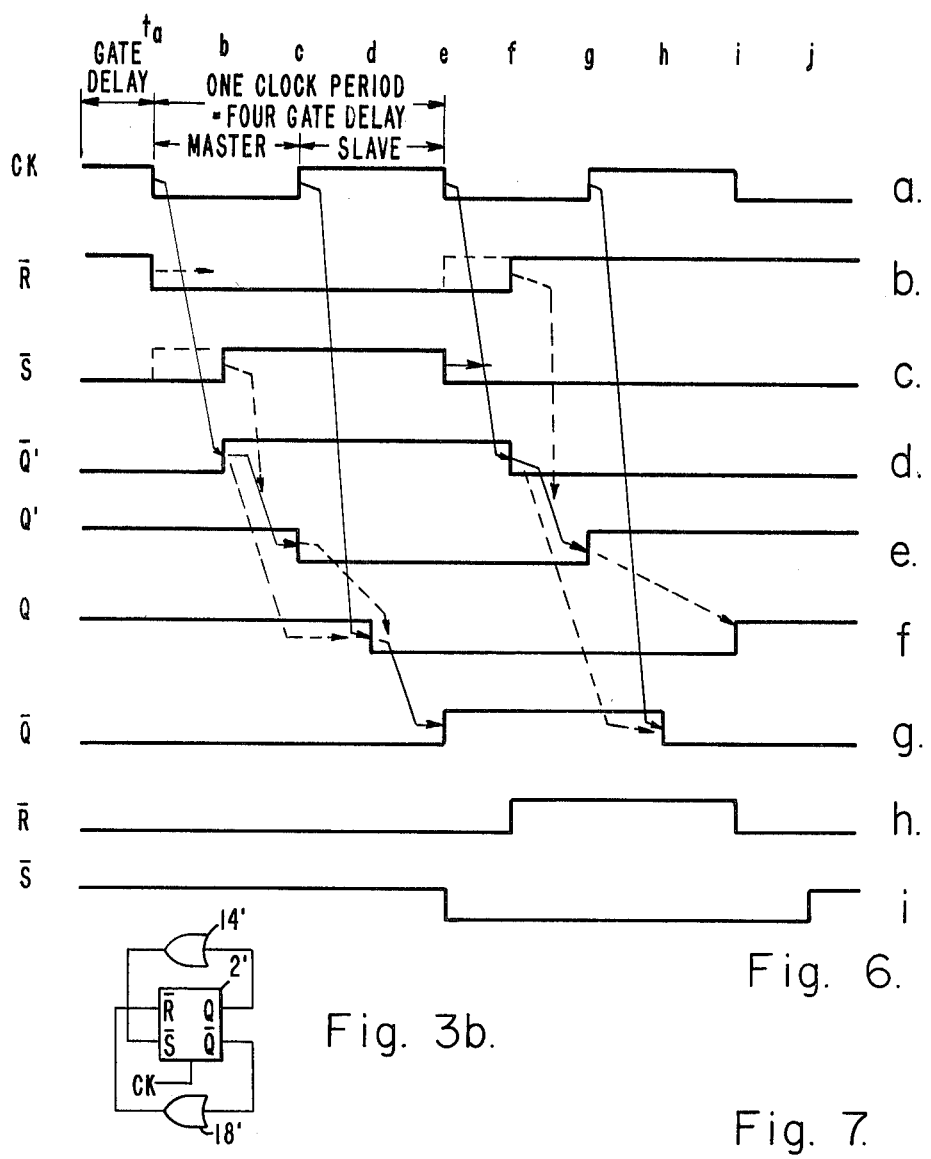
Fig. 6.
Fig. 3b.
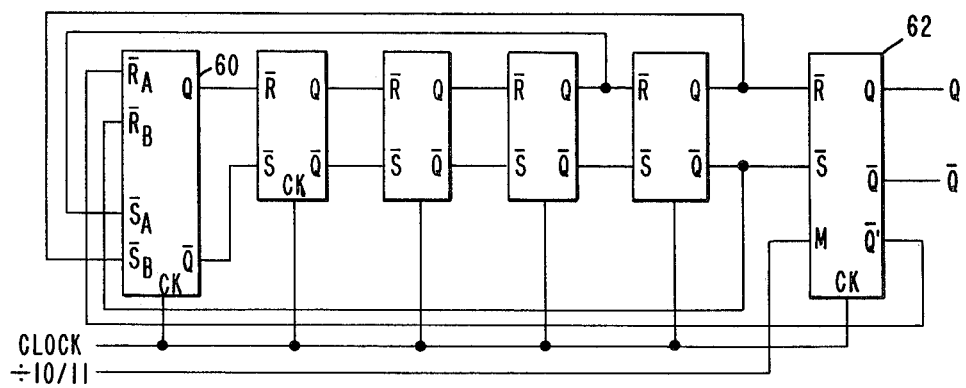
Fig. 7.

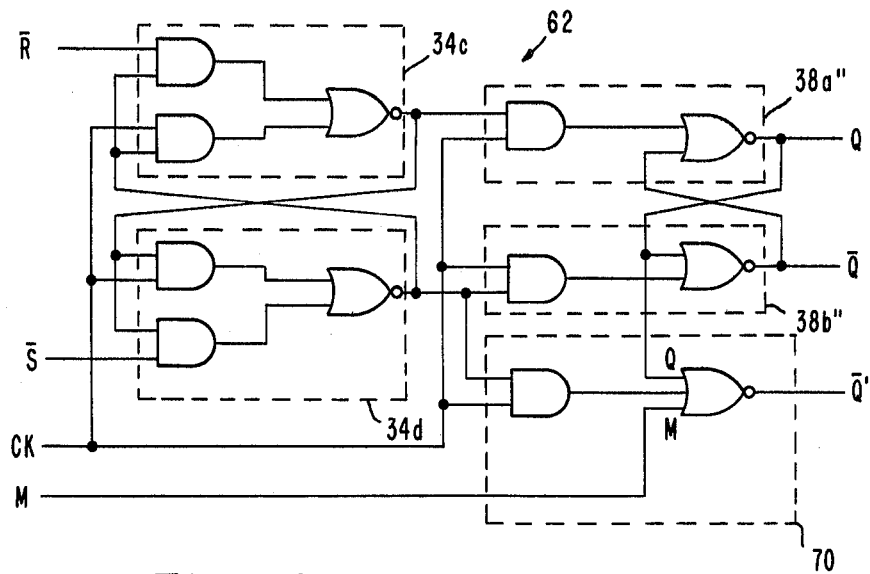
Fig. 10.
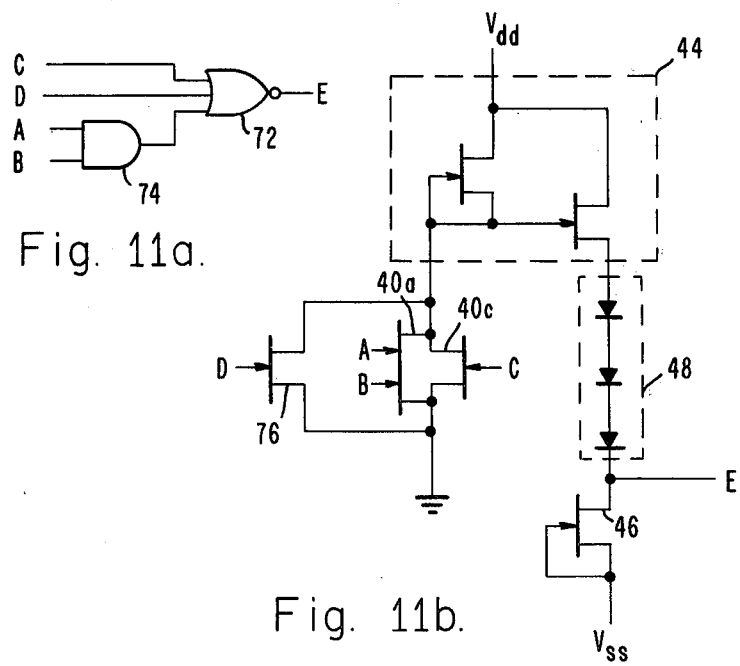
Fig. 11a.
Fig. 11b.

÷3/2

÷4/3

÷4/5

÷6/7

÷6/7

÷7/8

÷8/9

÷9/10

DUAL MODULUS COUNTER HAVING NON-INVERTING FEEDBACK

TECHNICAL FIELD

This invention is a dual modulus counter including a plurality of flip-flops connected in series having non-inverting feedback between the first and last flip-flops so that the counter may be run at a clock frequency equal to the maximum speed of each of the flip-flops.

BACKGROUND ART

The primary application of this invention is frequency synthesis and, in particular, pulse swallowing counters used in frequency synthesizers. Pulse swallowing counters of the prior art are disclosed in *E.C.L. Data Book*, Fairchild Camera and Instrument Corp. (Mountain View, Ca.), 1977, pages 9-56, 9-57 and 9-58.

Each of the flip-flops in such a counter is characterized by a maximum clock frequency, above which the flip-flop cannot be reliably operated. Typically, the counter must be operated substantially below this maximum clock frequency because of delays inherent in the feedback loop between the first and last flip-flops. An additional limitaton on the clock frequency is the necessity, typical with some flip-flops, of providing both a clock signal and a complementary clock signal to operate the master and slave portions, respectively, of each flip-flop. This latter limitaton arises for one of two reasons. First, if a complementary clock signal is derived from the reference clock signal by use of an inverter, the inverter itself imposes one gate delay worth of signal delay between the two clock signals, a delay which must be accommodated by a selection of a clock period one gate delay longer than would otherwise be necessary. (As used in this specification, the term "gate delay" refers to the time required for a logic change to propagate through one logic structure such as a NAND gate.) Alternatively, an independent complementary clock generator may be used, in which case the clock signal and its complement are not necessarily in phase, again imposing a delay between the two clock signals. Such a complementary clock generator is difficult to implement in some logic families such as gallium arsenide field effect transistor AND/NOR logic.

Typically, the prior art has not addressed the problems inherent in attempts to operate such dual modulus counters at the maximum clock frequency of the individual flip-flops comprising the counter. This is because the inherent delay in the feedback loop of such a counter made it impractical to run the counter at the maximum clock frequency of its flip-flops. Typically, such counters are run at frequencies significantly lower than the maximum clock frequency of the flip-flop. Thus, prior art dual modulus counters do not possess both the capability of being run at the maximum clock frequency of its individual flip-flops and the features required of such dual modulus counters. For example, one required feature in most systems is that the counter be self-initializing. That is, even though the counter may begin counting from any randomly entered state when power is first applied, it must eventually reach a counting sequence in which the desired dividing ratio is realized. Thus, the prior art has not made a counter which is both self-initializing and operable at the maximum clock rate for each flip-flop while tolerating the delay inherent in the feedback loop between the first and last flip-flops.

SUMMARY OF THE INVENTION

The present invention is a dual modulus ring counter which is operable at the maximum clock frequency of its individual flip-flops despite the delay inherent in its feedback loop and at the same time is self-intializing, all this being achieved by the use of non-inverting feedback between the first and last flip-flops and by the complementary operaton of the master and slave portions of each flip-flop without the use of a complementary clock signal.

Another feature of this invention is that all of the logic gates in the feedback path between the first and last flip-flops may be merged in parallel fashion into the logic elements of the first and last flip-flops so as to simplify the circuit design of such devices.

In the exemplary embodiments of the invention to be described in this specification, each flip-flop is an RS master-slave flip-flop in which the master and slave portions operate during opposite phases of the clock signal, each flip-flop characterized by a maximum clock frequency corresponding to a clock period of four gate delays. The entire counter may be run at this maximum clock rate because of the advantageous use by this invention of non-inverting feedback.

In an exemplary embodiment of this invention, non-inverting feedback is realized as follows: the $\overline{Q}$ outputs of the last two flip-flops are coupled through logic gates in the feedback loop to the $\overline{R}$ input of the first flip-flop while the Q output of the second to the last flip-flop is coupled through other logic gates in the feedback loop to the $\overline{S}$ input of the first flip-flop. Such non-inverting feedback utilizes the inherent delay between the responses of the Q an $\overline{Q}$ outputs of the last flip-flops so as to create a grace period. The grace period so created allows the feedback from the last flip-flops to reach the first flip-flop within the same clock period in which it was generated, despite the presence of gate delay in the feedback path.

In one specific embodiment, the counter comprises six flip-flops and the feedback path includes logic circuitry for selecting a terminal count of ten or eleven. (This type of counter will be referred to as a 10/11 dual modulus counter.) Each of the flip-flops is of the RS-type discussed previously wherein the Q and $\overline{Q}$ outputs of one are connected to the $\overline{R}$ and $\overline{S}$ inputs of the next one, the Q and $\overline{Q}$ outputs of the last two flip-flops being coupled to the R and S inputs of the first flop respectively as non-inverting feedback. During normal operation, the counter self-initializes so that all flip-flops are reset to a desired state.

In the divide-by-ten mode, ones are shifted from left to right until they reach the output of the fifth flip-flop. Then zeros are shifted from left to right until they reach the output of the fifth flip-flop. The operation is repeated as ones are again shifted from left to right in the previous manner. In the divide-by-eleven mode, ones are shifted from left to right until they reach the output of sixth flip-flop. Then zeros are shifted from left to right until they reach the output of the fifth flip-flop. The operation is again repeated as ones are shifted from left to right in the previous manner.

Similar ring counters of the prior art have required a clock period of five gate delays or more, in order to accommodate the delay in the feedback path. Because of the non-invertng feedback incorporated into the feedback loop of the counter of this invention, the counter will operate properly with a clock period equivalent to only four gate delays despite the presence of one gate delay in its feedback path. It is believed that this invention is the fastest dual modulus counter possible without using complementary clocks. It should be noted that prior art counters exist which are just as fast, but these require complementary clocks, a significant disadvantage. This counter is preferably implemented using gallium arsenide depletion mode field effect transistors comprising AND/NOR logic, although it can be implemented using any type of semiconductor technology, including MOSFET, JFET, or bi-polar transistors.

This invention achieves what was heretofore not believed possible, namely a counter operable at the maximum clock rate of its individual flip-flops without complementary clocks while tolerating the delay inherent in its feedback loop and at the same time being self-initializing.

DESCRIPTION OF THE FIGURES

The invention is best understood by reference to the accompanying drawings, of which:

FIG. 1a is a simplified schematic diagram of a 10/11 dual modulus counter of this invention;

FIG. 1b is a logic diagram of a feedback logic gate in the counter of FIG. 1a;

FIG. 1c is a schematic diagram of the preferred circuit implementation of the logic gate of FIG. 1b;

FIG. 1d is a logic diagram of another feedback logic gate of the counter of FIG. 1a;

FIG. 1e is a schematic diagram of the preferred circuit implementation of the logic gate of FIG. 1d;

FIG. 2 includes time domain waveforms corresponding to the counter FIG. 1a of which:

FIG. 2a is a diagram of the time domane waveform of the clock signal;

FIG. 2b is a diagram of the time domain waveform of the R input of the first flip-flop of FIG. 1a;

FIG. 2c is a diagram of the time domain waveform of the R input of the second flip-flop of FIG. 1a;

FIG. 2d is a diagram of the time domain waveform of the R input of the third flip-flop of FIG. 1a;

FIG. 2e is a diagram of the time domain waveform of the R input of the fourth flip-flop of FIG. 1a;

FIG. 2f is a diagram of the time domain waveform of the R input of the fifth flip-flop of FIG. 1a;

FIG. 2g is a diagram of the time domain waveform of the R input of the sixth flip-flop of FIG. 1a;

FIG. 2h is a diagram of the time domain waveform of the Q output of the sixth flip-flop of FIG. 1a; and FIG. 2i is a diagram of the time domain waveform of the mode control signal of the counter of FIG. 1a;

FIG. 3a is a logic diagram of the prior art R-S flip-flop typical of each of the flip-flops in the counter of FIG. 1a;

FIG. 3b is a logic diagram illustrating a simple counter comprising a single flip-flop of the type illustrated in FIG. 3a;

FIG. 4a is a logic diagram of a type of AND/NOR gate used in the flip-flop of FIG. 3a;

FIG. 4b is a circuit diagram illustrating the preferred implementation of the AND/NOR gate of FIG. 4a;

FIG. 5a is a logic diagram of another type of AND/NOR gate used in the flip-flop of FIG. 3a;

FIG. 5b is a circuit diagram illustrating the preferred implementation of the AND/NOR gate of FIG. 5a;

FIG. 6 includes diagrams illustrating the flip-flop operation, of which:

FIG. 6a illustrates the clock signal waveform;

FIG. 6b illustrates the $\bar{R}$ input signal waveform;

FIG. 6c illustrates the $\bar{S}$ input signal waveform;

FIG. 6d illustrates the $\bar{Q}'$ output signal waveform;

FIG. 6e illustrates the Q' output signal waveform;

FIG. 6f illustrates the Q output signal waveform;

FIG. 6g illustrates the $\bar{Q}$ output signal waveform;

FIG. 6h illustrates the feedback $\bar{R}$ input signal waveform;

FIG. 6i illustrates the feedback S input signal waveform;

FIG. 7 is a schematic diagram of an improved verson of the counter of FIG. 1a wherein the logic gates in each of the feedback paths are merged into the first and last flip-flops;

FIG. 9b is a circuit diagram illustrating the implementation of the AND/NOR gate of FIG. 9a;

FIG. 10 is a logic diagram illustrating the sixth flip-flop of the merged counter of FIG. 7;

FIG. 11a is a logic diagram illustrating an AND/NOR gate used in the flip-flop of FIG. 10;

FIG. 11b is a circuit diagram illustrating the implementation of the AND/NOR gate of FIG. 11a;

FIG. 12 is a simplified diagram of a partially merged counter corresponding to the counter of FIG. 1a;

DETAILED DESCRIPTION OF THE INVENTION EXEMPLARY 10/11 COUNTER

Figure 2:
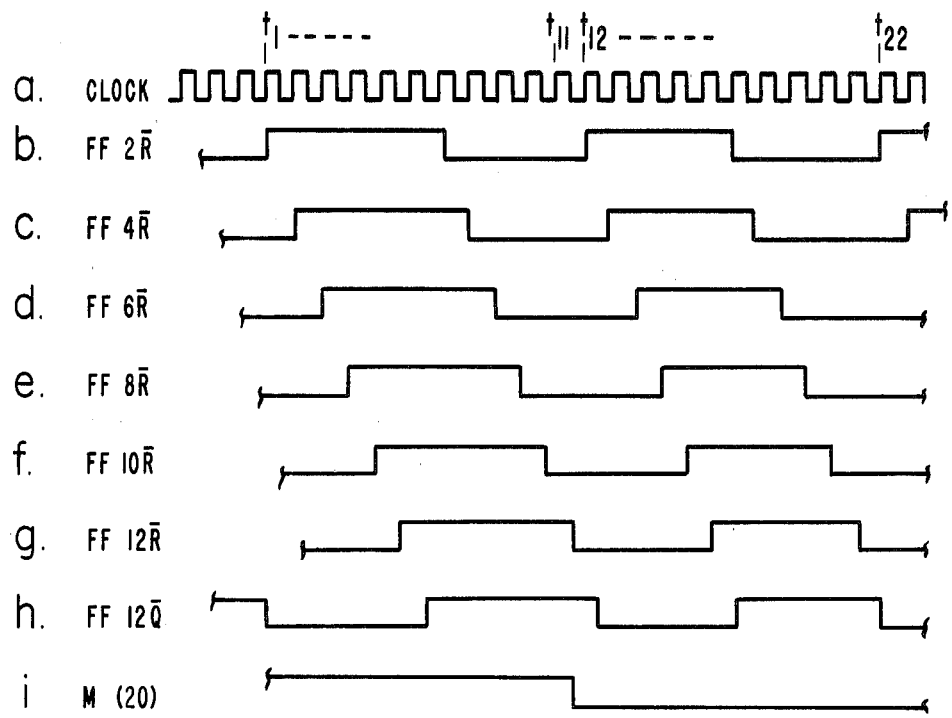

This invention may be implemented in a 10/11 dual modulus counter of the type illustrated in the simplified schematic diagram of FIG. 1a. This exemplary counter includes six clocked RS flip-flops 2, 4, 6, 8, 10, 12 each having inputs $\bar{R}$, $\bar{S}$ and outputs Q and $\bar{Q}$ connected together in serial fashion as illustrated in FIG. 1a. The ring counter function is realized by constructing the following feedback loops: First, the Q output of the flip-flop 8 is connected to one input of an OR gate 14 having its output connected to the $\bar{S}$ input of the flip-flop 2, the other input to the OR gate 14 being connected to the $\bar{Q}$ output of the flip-flop 10; Secondly, the Q output of the last flip-flop 12 is connected to the input of an AND gate 16 having its output connected to the input of an OR gate 18 which in turn has its output connected to the $\overline{R}$ input of flip-flop 2, the remaining input to the AND gate 16 being connected to a mode control line 20 and the remaining input to the OR gate 18 being connected to the $\overline{Q}$ of the flip-flop 10. A clock signal line 22 connects the clock input of each flip-flop 2, 4, 6, 8, 10, 12 to a reference clock signal generator (not shown). The mode control line 20 forces the counter of FIG. 1a to reach a terminal count of 11 by applying a logic 1 to the AND gate 16 or, alternatively, forces the counter of FIG. 1a to reach a terminal count of 10 by applying a logic 0 to the input of the AND gate 16.

The sequence of logic states of the dual modulus counter of FIG. 1a is summarized in Table 1 (below) for the case in which the mode line 20 is set to a logic 1 so that the counter counts by 11 in Table 2 for the case in which the mode line 20 is set to a logic 0 so that the counter counts by 10.

TABLE 1

| Count (Time) | ELEVEN COUNT FLIP-FLOP | | | | | | | | | | | | | MODE LINE (20) |
|---|---|---|---|---|---|---|---|---|---|---|---|---|---|---|
| | 2 $\overline{R}$ | $\overline{S}$ | 4 $\overline{R}$ | $\overline{S}$ | 6 $\overline{R}$ | $\overline{S}$ | 8 $\overline{R}$ | $\overline{S}$ | 10 $\overline{R}$ | $\overline{S}$ | 12 $\overline{R}$ | $\overline{S}$ | Q | $\overline{Q}$ | |
| 1 | 1 | 0 | 0 | 1 | 0 | 1 | 0 | 1 | 0 | 1 | 0 | 1 | 0 | 1 | 1 |
| 2 | 1 | 0 | 1 | 0 | 0 | 1 | 0 | 1 | 0 | 1 | 0 | 1 | 0 | 1 | 1 |
| 3 | 1 | 0 | 1 | 0 | 1 | 0 | 0 | 1 | 0 | 1 | 0 | 1 | 0 | 1 | 1 |
| 4 | 1 | 0 | 1 | 0 | 1 | 0 | 1 | 0 | 0 | 1 | 0 | 1 | 0 | 1 | 1 |
| 5 | 1 | 1 | 1 | 0 | 1 | 0 | 1 | 0 | 1 | 0 | 0 | 1 | 0 | 1 | 1 |
| 6 | 1 | 1 | 1 | 0 | 1 | 0 | 1 | 0 | 1 | 0 | 1 | 0 | 0 | 1 | 1 |
| 7 | 0 | 1 | 1 | 0 | 1 | 0 | 1 | 0 | 1 | 0 | 1 | 0 | 1 | 0 | 1 |
| 8 | 0 | 1 | 0 | 1 | 1 | 0 | 1 | 0 | 1 | 0 | 1 | 0 | 1 | 0 | 1 |
| 9 | 0 | 1 | 0 | 1 | 0 | 1 | 1 | 0 | 1 | 0 | 1 | 0 | 1 | 0 | 1 |
| 10 | 0 | 1 | 0 | 1 | 0 | 1 | 0 | 1 | 1 | 0 | 1 | 0 | 1 | 0 | 1 |
| 11 | 0 | 1 | 0 | 1 | 0 | 1 | 0 | 1 | 0 | 1 | 1 | 0 | 1 | 0 | 1 |
| 1 | 1 | 0 | 0 | 1 | 0 | 1 | 0 | 1 | 0 | 1 | 0 | 1 | 1 | 0 | 1 |
| 2 | 1 | 0 | 1 | 0 | 0 | 1 | 0 | 1 | 0 | 1 | 0 | 1 | 0 | 1 | 1 |

TABLE 2

| Count (Time) | TEN COUNT FLIP-FLOP | | | | | | | | | | | | | MODE LINE (20) |
|---|---|---|---|---|---|---|---|---|---|---|---|---|---|---|
| | 2 $\overline{R}$ | $\overline{S}$ | 4 $\overline{R}$ | $\overline{S}$ | 6 $\overline{R}$ | $\overline{S}$ | 8 $\overline{R}$ | $\overline{S}$ | 10 $\overline{R}$ | $\overline{S}$ | 12 $\overline{R}$ | $\overline{S}$ | Q | $\overline{Q}$ | |
| 1 | 1 | 0 | 0 | 1 | 0 | 1 | 0 | 1 | 0 | 1 | 0 | 1 | 0 | 1 | 0 |
| 2 | 1 | 0 | 1 | 0 | 0 | 1 | 0 | 1 | 0 | 1 | 0 | 1 | 0 | 1 | 0 |
| 3 | 1 | 0 | 1 | 0 | 1 | 0 | 0 | 1 | 0 | 1 | 0 | 1 | 0 | 1 | 0 |
| 4 | 1 | 0 | 1 | 0 | 1 | 0 | 1 | 0 | 0 | 1 | 0 | 1 | 0 | 1 | 0 |
| 5 | 1 | 1 | 1 | 0 | 1 | 0 | 1 | 0 | 1 | 0 | 0 | 1 | 0 | 1 | 0 |
| 6 | 0 | 1 | 1 | 0 | 1 | 0 | 1 | 0 | 1 | 0 | 1 | 0 | 0 | 1 | 0 |
| 7 | 0 | 1 | 0 | 1 | 1 | 0 | 1 | 0 | 1 | 0 | 1 | 0 | 1 | 0 | 0 |
| 8 | 0 | 1 | 0 | 1 | 0 | 1 | 1 | 0 | 1 | 0 | 1 | 0 | 1 | 0 | 0 |
| 9 | 0 | 1 | 0 | 1 | 0 | 1 | 0 | 1 | 1 | 0 | 1 | 0 | 1 | 0 | 0 |
| 10 | 0 | 1 | 0 | 1 | 0 | 1 | 0 | 1 | 0 | 1 | 1 | 0 | 1 | 0 | 0 |
| 1 | 1 | 0 | 0 | 1 | 0 | 1 | 0 | 1 | 0 | 1 | 0 | 1 | 1 | 0 | 0 |
| 2 | 1 | 0 | 1 | 0 | 0 | 1 | 0 | 1 | 0 | 1 | 0 | 1 | 0 | 1 | 0 |

The operation is illustrated in the exemplary timing diagram of FIG. 2, in which the mode line 20 is held to a logic 1 for a first time period ($t_1$ to $t_{12}$) and is then changed (in this example) to a logic 0 for a second time period ($t_{12}$ to $t_{22}$). Thus, the waveforms illustrated in the timing diagrams of FIG. 2 from time $t_1$ to time $t_{12}$ correspond to the logic states tabulated in Table 1, while those from time $t_{12}$ to time $t_{22}$ correspond to Table 2.

Referring to FIG. 2, when the clock signal of FIG. 2a goes high (logic 1) at time $t_1$, the $\overline{R}$ input of the first flip-flop 2 illustrated in FIG. 2b changes from a logic 0 to a logic 1. At time $t_2$, the $\overline{R}$ input of the next flip-flop 4 illustrated in FIG. 2c changes from a logic 0 to a logic 1 and this change is repeated successively by each of the remaining flip-flops 6 through 12 in turn. At time $t_7$, the $\overline{R}$ input to the first flip-flop 2, in response to feedback through the AND gate 16 and the OR gate 18, changes from a logic 1 to a logic 0. Then, at time $t_8$, the $\overline{R}$ input of the next flip-flop 4 changes from a logic 1 to a logic 0, so that 0's are successively propagated from left to right through each of the flip-flops 2 through 12. Thereafter, at time $t_{12}$, the $\overline{R}$ input of the first flip-flop 2, in response to feedback through the AND gate 16 and the OR gate 18, changes from a logic 0 to a logic 1. At this time, the number of elapsed clock periods is equal to 11, the terminal count, and the counter is ready to repeat the process. However, as illustrated in FIG. 2, the logic state transmitted on the mode line 20 is changed (by a selection made externally) from a logic 1 to a logic 0, so that the counter is now forced to count by 10. Thus, beginning at time $t_{12}$ a succession of logic 1's is again propagated from left to right through the counter FIG. 1a. At time $t_{17}$, the $\overline{R}$ input of the first flip-flop 2, in response to feedback through the AND gates 16 and the OR gate 18, changes from a logic 1 to a logic 0 so that a succession of logic 0's is now propagated from left to right through the counter of FIG. 1a. Thereafter, at time $t_{22}$, the $\overline{R}$ input of the first flip-flop 2, in response to the feedback through the AND gate 16 and the OR gate 18, changes from a logic 0 to a logic 1, thus completing the count. The number of elapsed clock periods is now 10, the terminal count, and the counter repeats the cycle in a continuous manner. Tables 1 and 2 and the timing diagram of FIG. 2 were all generated in a straight-forward manner from the schematic diagram of FIG. 1a and it is contemplated that a skilled worker may verify the foregoing by referring to FIG. 1a.

SINGLE CLOCK OPERATION

Figure 3A:
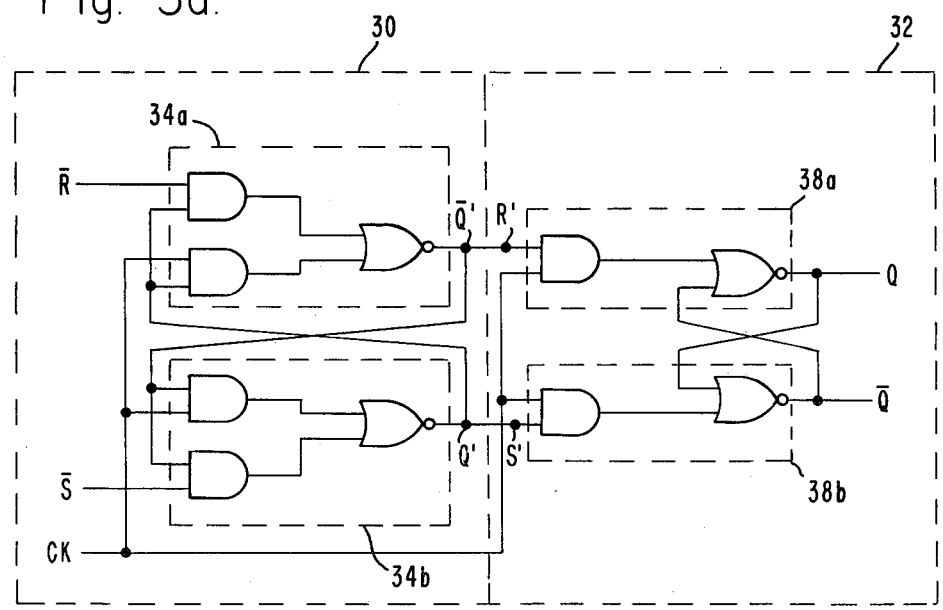

The requirement in some prior art counters for two complementary clock signals is eliminated in this invention by the use of the clocked R-S master-slave flip-flop illustrated in the logic diagram of FIG. 3a for each of the flip flops 2, 4, 6, 8, 10, 12 of FIG. 1a. The flip-flop of FIG. 3a is divided into a master 30 and a slave 32. The master 30 includes the $\overline{R}$, $\overline{S}$ and clock inputs and is made of two merged AND/NOR gates 34a, 34b cross coupled with one another in the manner illustrated in FIG. 3a. Each of the AND/OR gates 34a, 34b corresponds to the AND/NOR gate illustrated in FIG. 4a and is preferably implemented in the manner illustrated in the schematic circuit diagram of FIG. 4b. Each AND/NOR gate 34a, b of the master 30 includes two AND gates 36a, 36b and a NOR gate 36c having two inputs connected to the outputs of the AND gates 36a, b. The combination of the two AND gates 36a, 36b and the NOR gate 36c are implemented as a merged logic structure as shown in FIG. 4b by connecting two dual-gate field effect transistors 40a, 40b in parallel between substrate ground 42 and the input to a buffer amplifier 44 comprising two field effect transistors 44a, 44b. The output of the buffer amplifier 44 is connected to a load transistor 46 across three diodes 48a, b, c. Preferably, the circuit of FIG. 4b is implemented on a gallium arsenide substrate using depletion mode field effect transistors, the diodes 48a, b, c being Schottky diodes which provide a suitable voltage transition between the output of the buffer amplifier 44 and the output of the logic gate 34.

Figure 4B:
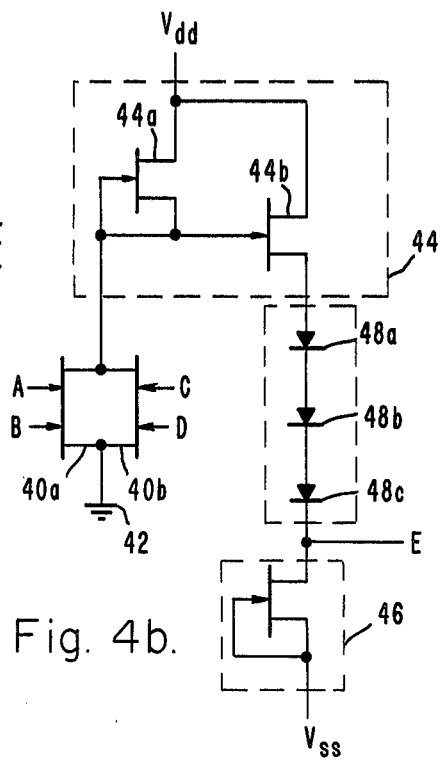
Figure 5A:
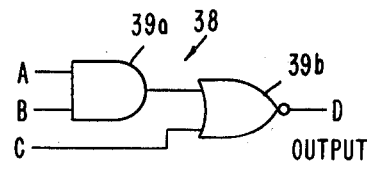
Figure 5B:
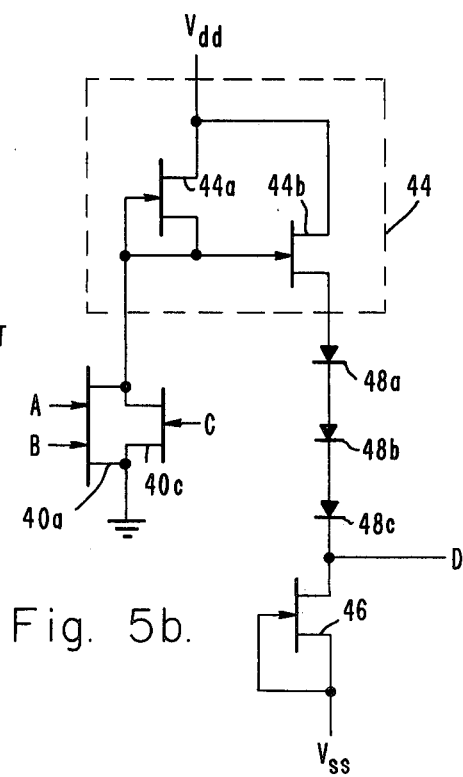

The slave 32 comprises two AND/NOR gates 38a, 38b, each corresponding to the AND/NOR gate 38 of FIG. 5a. The implementation of the AND/NOR gate 38 is illustrated in FIG. 5b, and differs slightly from the implementation of the AND/NOR gate 34 illustrated in FIG. 4b in that the dual-gate field effect transistor 40b is replaced by a single gate field effect transistor 40c.

Referring again to FIG. 3a, the master 30 has its outputs Q' and $\overline{Q}'$ connected to the inputs S' and R' respectively of the slave 32. As is well known in the art, it is necessary for the master 30 and slave 32 to operate alternately rather than simultaneously. For example, a logic signal at one of the inputs $\overline{R}$, $\overline{S}$ to the master 30 will generate a change in the outputs $\overline{Q}'$, Q' of the master 30 after one and two gate delays respectively. Referring to FIG. 4b, the duration of this gate delay is determined by the amount of time it takes for a logic change at one of the inputs or gate electrodes A, B, C, D, of the two dual-gate transistors 40a, 40b to cause a logic change at output E of the circuit of FIG. 4b. The master outputs Q' does not reflect the logic change until the end of two gate delays and, therefore, the operation of the slave 32 must be postponed for two gate delays, at which time the outputs Q', $\overline{Q}'$ (each corresponding to the output E of FIG. 4) reflect the desired logic change. Then, and only then, should the slave 32 be enabled to respond. As previously discussed, the use of such complementary clock signals is not desirable. Accordingly, a single clock signal operates both the master 30 and slave 32. However, a skilled worker may discern from the logic diagram of FIG. 3a that the master 30 is activated only during the half cycle of the clock when the clock signal is high (logic 1) while the slave 32 is activated during the remaining cycle when the clock signal is low (logic 0). Accordingly, the complementary operation of the master slave RS flip-flop of FIG. 3a does not require a complementary clock so that a single clock signal is sufficient, a significant advantage.

The function of the flip-flop of FIG. 3a is summarized in the truth table below.

TABLE 3

| Present State | | | Next State |
|---|---|---|---|
| Q | $\overline{R}$ | $\overline{S}$ | Q |
| 0 | 1 | 1 | 0 |
| 1 | 1 | 1 | 1 |
| 1 or 0 | 1 | 0 | 0 |
| 1 or 0 | 1 | 1 | 1 |
| 1 or 0 | 0 | 0 | (indeterminant) |

NON-INVERTING FEEDBACK

The maximum clock frequency of the flip-flop of FIG. 3a corresponds to a clock period equal to four times the gate delay through a single AND/NOR gate. As will be explained below, it is not possible to operate the flip-flop at a faster clock rate without losing synchronism between the master 30 and the slave 32, due to the delay in signal propagation therethrough. Typically, the delay through the master 30 is equal to the delay through the slave 32. While it may be possible to operate a single flip-flop illustrated in FIG. 3a at the maximum clock frequency, it would not seem possible to operate, for example, the entire counter of FIG. 1a at this same clock rate, in view of the inherent delays in the feedback path from the Q, $\overline{Q}$ outputs of the last two flip-flops 10, 12 to the $\overline{R}$, $\overline{S}$ inputs of the first flip-flop 2. The delay in the feedback path is critical because the first flip-flop 2 must receive the feed-back output from the last flip-flops 10, 12 before the beginning of the next clock period.

The non-inverting feedback of this invention makes possible the operation of the counter of FIG. 1 at the maximum clock rate of each of the flip-flops by taking advantage of the inherent delay between logic changes in the Q and $\overline{Q}$ outputs of each flip-flop so as to gain an additional grace period equivalent to one gate delay for logic changes to be fedback from the last flip-flops 10, 12 to the first flip-flop 2. In this way, the counter of FIG. 1 may operate at the flip-flops maximum clock rate while tolerating one gate delay in its feedback path.

SIMPLIFIED EXAMPLE

The acquisition of this grace period by the non-inverting feedback of this invention is best understood in connection with the exāmplary operation of a very simple counter illustrated in FIG. 3b having non-inverting feedback. The simple counter of FIG. 3b comprises a single flip-flop 2' of the same type illustrated in FIG. 3a, an OR gate 14' connected between the Q output and S input of the flip-flop 2' and an OR gate 18' connected between the $\overline{Q}$ output and the $\overline{R}$ input of the flip-flop 2'. The timing diagrams of FIG. 6 shall now be used to illustrate the operation of the simple counter of FIG. 3b at the maximum clock frequency corresponding to a clock period of four gate delays.

FIG. 6a is a diagram of the time domain waveform of the clock signal having a clock period equal to four gate delays, which is applied to the master 30 and slave 32 (illustrated in FIG. 3a) of the flip-flop 2' of FIG. 3b. FIGS. 6b and 6c illustrate the time domain waveforms of the R and S inputs, respectively, of the master 30. FIGS. 6d and 6e illustrate the time domain waveforms at the outputs Q' and Q' respectively, of the master 30, which are in turn connected to the inputs R', S', respectively, of the slave 32. FIGS. 6f and 6g illustrate the time domain waveforms of the Q and $\overline{Q}$ outputs, respectively, of the slave 32.

FIG. 6 illustrates two cases. In the first case, at time $t_a$ of FIG. 6, the $\overline{R}$ input is changed from a logic 1 to a logic 0 (as illustrated in FIG. 6b) and not later than one gate delay later at time $t_b$ the $\overline{S}$ input is changed from a logic 0 to a logic 1 (as illustrated in FIG. 6c). In the second case, at time $t_e$ the $\overline{S}$ input is changed from a logic 1 to a logic 0 (as illustrated in FIG. 6c) and one gate delay later at time $t_f$ the $\overline{R}$ input is changed from a logic 0 to a logic 1 (as illustrated in FIG. 6b).

Turning now to the first case, the resulting output state of the flip-flop 2' is reflected by the Q output at time $t_d$ (as illustrated in FIG. 6f) when it changes from a logic 1 to a logic 0 and by the $\overline{Q}$ output (as illustrated in FIG. 6g) at time $t_e$ when it changes from a logic 0 to a logic 1.

Referring now to the second case, at time $t_h$ the $\overline{Q}$ input changes from a logic 1 to a logic 0 and the Q output changes from a logic 0 to a logic 1 at time $t_1$.

A common result is immediately apparent for both cases, namely, that the falling edge of each of the outputs Q, $\overline{Q}$ always occurs one gate delay before the rising edge of the other of the outputs Q, $\overline{Q}$. For example, in the first case the waveform of the Q output illustrated in FIG. 6f has a falling edge at time $t_d$ and the corresponding rising edge in the $\overline{Q}$ output of FIG. 6g occurs one gate delay later at time $t_e$. Likewise, in the second case the falling edge of the $\overline{Q}$ waveform of the FIG. 6g occurs at time $t_h$ one gate delay before the corresponding rising edge of the Q waveform of FIG. 6f at time $t_i$. This delay between falling and rising edges in the Q, $\overline{Q}$ output waveforms is a significant feature utilized in the invention as will be explained below.

FIG. 6 shows that, at the maximum clock rate of four gate delays, the Q and $\overline{Q}$ outputs responds within one clock period to changes in the $\overline{R}$ and $\overline{S}$ inputs. For example, in response to the changes in the $\overline{R}$ and $\overline{S}$ inputs illustrated in FIG. 6b and 6c at time $t_a$ and $t_b$ respectively, the $\overline{Q}$ output changes four gate delays later at time $t_e$, just as the slave 32 is disabled by the falling edge of the clock signal of FIG. 6a. Any change in the Q output after time $t_e$ is impossible because the slave 32 is disabled thereafter. Thus, FIG. 6 illustrates the fastest possible operation of the counter of FIG. 3b. For example, in the first case, if the falling edge of the $\overline{R}$ input waveform illustrated in FIG. 6b at time $t_a$ were delayed until after $t_a$, there would not be enough time for the $\overline{Q}$ output of the flip-flop 2' to respond before the end of the clock period at time $t_e$. Likewise, in the second case, if the falling edge of the waveform of the $\overline{S}$ input illustrated in FIG. 6c at time $t_e$ were delayed until after time $t_e$, there would not be enough time for the Q output of the flip-flop 2' to respond before the end of the clock period at time $t_i$ and the counter of FIG. 3b would not function properly.

Thus, there is a common constraint governing the operation of both cases, namely that, at the maximum clock rate of four gate delays illustrated in FIG. 6a, the falling edge of the $\overline{R}$ or $\overline{S}$ input waveform must occur at or before the beginning of the clock period defined by the falling edge of the clock signal (illustrated in FIG. 6a at time $t_a$ in the first case and at time $t_e$ in the second case). As a corollary to this constraint, the rising edge of the waveform of the $\overline{R}$ or $\overline{S}$ inputs may occur as long as one gate delay after the falling edge, and the counter of FIG. 3b will still operate. Specifically, in the first case, the rising edge of the $\overline{S}$ input waveform of FIG. 6c occurs one gate delay at time $t_b$ after the corresponding falling edge of the $\overline{R}$ input waveform of FIG. 6b. Likewise, in the second case, the rising edge of the $\overline{R}$ input waveform illustrated in FIG. 6b at time $t_f$ occurs one gate delay after a corresponding falling edge of the $\overline{S}$ input waveform of FIG. 6c. Nevertheless, the Q and $\overline{Q}$ outputs respond to the delayed changes within the same clock period.

At this point, the advantage of the non-inverting feedback of this invention should be apparent. Specifically, the non-inverting feedback of this invention guarantees that the falling edge output of the $\overline{Q}$ and Q output waveforms is always fed back as the falling edge of the $\overline{R}$ or $\overline{S}$ input waveforms of the flip-flop 2'. Thus, ignoring for the moment that the logic gates 14', 18', impose one gate delay in the feedback path, the falling edges of the $\overline{R}$ or $\overline{S}$ inputs would occur one gate delay before they are actually required (as illustrated in dashed line in FIGS. 6b and 6c), thus giving rise to a grace period of one gate delay. However, this grace period is, in reality, consumed by the gate delay of the logic gates 14', 18' present in the feedback path so that the feedback reaches the $\overline{R}$, $\overline{S}$ inputs just as the clock period is ending. Thus, the counter of FIG. 3b may be operated at the maximum flip-flop clock rate in the manner illustrated in FIG. 6 despite the presence of one gate delay in the feedback path between its outputs $\overline{Q}$ and Q and its inputs $\overline{R}$ and $\overline{S}$.

MAXIMUM SPEED OPERATION OF THE 10/11 COUNTER OF FIG. 1a

The operation of the 10/11 counter of FIG. 1a at the maximum clock rate will now be discussed in connection with FIG. 4. FIG. 6 will now be employed in a different sense in that the $\overline{R}$ and $\overline{S}$ input waveforms of FIGS. 6b and 6c and the Q and $\overline{Q}$ output waveforms of FIGS. 6f and 6g shall represent the operation of the $\overline{R}$ and $\overline{S}$ inputs and the Q and $\overline{Q}$ outputs, respectively, of the flip-flop 10 of FIG. 1a while the $\overline{R}$ and $\overline{S}$ input waveforms of FIGS. 6h and 6i illustrate the operation of the $\overline{R}$ and $\overline{S}$ inputs of the first flip-flop 2 of FIG. 1a.

Significantly, the falling edge of the Q output waveform of FIG. 6f (corresponding to the flip-flop 10) does not cause a corresponding falling edge in the $\overline{S}$ input waveform of FIG. 6i (corresponding to the first flip-flop 2) until one gate delay later at time $t_e$, due to the gate delays present in the feedback path comprising the logic gate 14. Likewise, the rising edge of the $\overline{Q}$ output waveform of FIG. 6g at time $t_e$ (corresponding to the flip-flop 10) does not cause a corresponding rising edge in the $\overline{R}$ input waveform of FIG. 6h (corresponding to the first flip flop 2) until one gate delay later time $t_f$. However, this one gate delay through the feedback path is tolerable because the falling edge at the $\overline{S}$ input occurs simultaneously with the falling edge of the clock signal of FIG. 6a at time $t_e$, thus complying with the constraint necessary for proper operation discussed previously.

The falling edge of the $\overline{Q}$ output waveform of FIG. 6 at time $t_h$ (corresponding to the flip-flop 10) does not cause a corresponding falling edge in $\overline{R}$ input waveform of FIG. 6h (corresponding to the first flip-flop 2) until one gate delay later at time $t_i$ due to the gate delay of the logic elements 16, 18 in the feedback path. Like-wise, the rising edge of the Q output waveform of FIG. 6f (corresponding to the flip-flop 10) does not cause a corresponding rising edge in the $\overline{S}$ input waveform of FIG. 6i (corresponding to the first flip-flop 2) until one gate delay later at time $t_j$. Nevertheless, the falling edge of the $\overline{R}$ input waveform occurs simultaneously at time $t_i$ with the falling edge of the clock signal of FIG. 6a so that, again, the constraints for proper operation at the maximum clock rate are met despite the presence of one gate delay in the feedback path.

In typical ring counters of the prior art, the output of the last flip-flop is generally inverted before being fed back to the inputs of the first flip-flop of the ring counter. Accordingly, such a prior art counter could not be operated at the maximum clock rate of its individual flip-flops because it could not tolerate delays in the feedback path between its first and last flip-flops at high clock frequencies. Thus, the prior art has been generally unconcerned with attempting to operate ring counters at the maximum clock rate of a flip-flop, because the delays in the feedback path would impede such operation.

INTERNAL OPERATION OF THE FLIP-FLOP 10 OF FIG. 1a

A detailed description of the operation of the flip-flop 10 of FIG. 1a will now be described by simultaneous reference to FIG. 3a and FIGS. 6a through 6g. (It should be understood that this description is typical of each of the flip-flops 2 through 12 of FIG. 1a.) FIGS. 6b, 6c, 6f and 6g correspond to the $\overline{R}$, $\overline{S}$, Q and $\overline{Q}$ waveforms respectively of the flip-flop 10. The time domain waveforms of FIGS. 6d and 6e correspond to the intermediate $\overline{Q}'$ and $Q'$ outputs, respectively, of the master 30 (illustrated in FIG. 3a) of the flip-flop 10 of FIG. 1a.

At time $t_a$, both the clock signal and the $\overline{R}$ input change to a logic 0 as illustrated in FIGS. 6a and 6b. This logic change propagates through the master 30 so that one gate delay later at time $t_b$, the $\overline{Q}'$ output changes to a logic 1 as illustrated in FIG. 6d. Simultaneously, the $\overline{S}$ input of the master 30 is changed to a logic 1 at time $t_b$ as illustrated in FIG. 6c. The changes in the $\overline{S}$ and $\overline{Q}'$ waveforms at time $t_b$ propagate through the AND/NOR gate 34b so that, one gate delay later at time $t_c$, the $Q'$ output changes to a logic 0. This completes the operation of the master 30 and, simultaneously, the clock signal of FIG. 6a changes to a logic 1, thus disabling the master 30 and enabling the operation of the slave 32. The logic change of the clock signal at time $t_c$ causes the change in the $\overline{Q}'$ output to propagate through the AND/NOR gate 38a of the slave 32 so that, one gate delay later at time $t_d$, the Q output of the slave 32 changes from a logic 1 to a logic 0. The change in the Q output causes the AND/NOR gate 38b to respond to the change in the intermediate $Q'$ output so that, one gate delay later at time $t_e$, the $\overline{Q}$ output changes from a logic 0 to a logic 1. This completes the operation of the slave 32 and, simultaneously at time $t_e$, the clock signal of FIG. 6a changes to a logic 0, thus disabling the slave 32 and enabling the master 30 for the next clock period.

At the beginning of the next clock period, the $\overline{S}$ input of the master 30 changes at time $t_b$ from a logic 1 to a logic 0 just as the clock signal in FIG. 6a is changing from a logic 1 to a logic 0. This logic change propagates through the master 30 so that, one gate delay later at time $t_f$, the intermediate $\overline{Q}'$ output changes from a logic 1 to a logic 0 as illustrated in FIG. 6d. Simultaneously, the $\overline{R}$ input of the master 30 is changed from a logic 0 to a logic 1 at time $t_f$, as illustrated in FIG. 6b. The changes at time $t_f$ at the $\overline{R}$ input and at the intermediate $\overline{Q}'$ output propagate through the master 30 so that, one gate delay later at time $t_g$, the intermediate output $Q'$ changes from a logic 0 to a logic 1 as illustrated in FIG. 6e. This completes the operation of the master 30 during this clock period and, simultaneously, the clock signal changes from a logic 0 to a logic 1 at time $t_g$, thus disabling the master 30 and enabling the slave 32. The change in the clock signal at time $t_g$ causes the change in the intermediate output $Q'$ to propagate through the AND/NOR gate 38b, so that, one gate delay later at time $t_h$, the $\overline{Q}$ output of the slave 32 changes from a logic 1 to a logic 0 as illustrated in FIG. 6g. The change in the $\overline{Q}$ output propagates through the AND/NOR gate 38a so that it responds to the change in the intermediate $\overline{Q}'$ output connected to the intermediate R input of the slave 32 and, one gate delay later at time $t_i$, the Q output changes from a logic 0 to a logic 1. This completes the operation of the flip-flop 10 for this clock period and, simultaneously at time $t_i$, the clock signal of FIG. 6a changes from a logic 1 to a logic 0, thus disabling the slave 32 and enabling the master 30 for the next clock period.

From the foregoing, it should be apparent that the master 30 and slave 32 operate in complementary fashion as mentioned previously so that the slave 32 waits for an appropriate period of time for changes at the $\overline{R}$ and $\overline{S}$ inputs of the master 30 to propagate through the master 30 to the intermediate outputs $\overline{Q}'$ and $Q'$.

IMPLEMENTATION OF THE FEEDBACK GATES 14, 16, 18 OF THE COUNTER OF FIG. 1

The OR gate 14 of FIGS. 1a and 1d may be implemented with two parallel depletion mode field effect transistors 14a, 14b and a load transistor 14c as illustrated in FIG. 1e. The AND gate 16 and the OR gate 18 of FIGS. 1a and 1b may be merged together into one device having only one gate delay using a single gate field effect 18a transistor connected in parallel with a dual-gate field effect transistor 16a, and a load transistor 18b as illustrated in FIG. 1c. The implementation of the logic gates 14, 16, and 18 illustrated in FIGS. 1c and 1e limits the delay in the feedback path of the counter of FIG. 1a to one gate delay, as required. It should be noted that a high forward transconductance is required in each of the transistors 14a, 14b, 16a, 18a of FIGS. 1e and 1c in order for the gates of FIGS. 1d and 1b to have adequate gain.

MERGED DUAL MODULUS COUNTER

Figure 8:
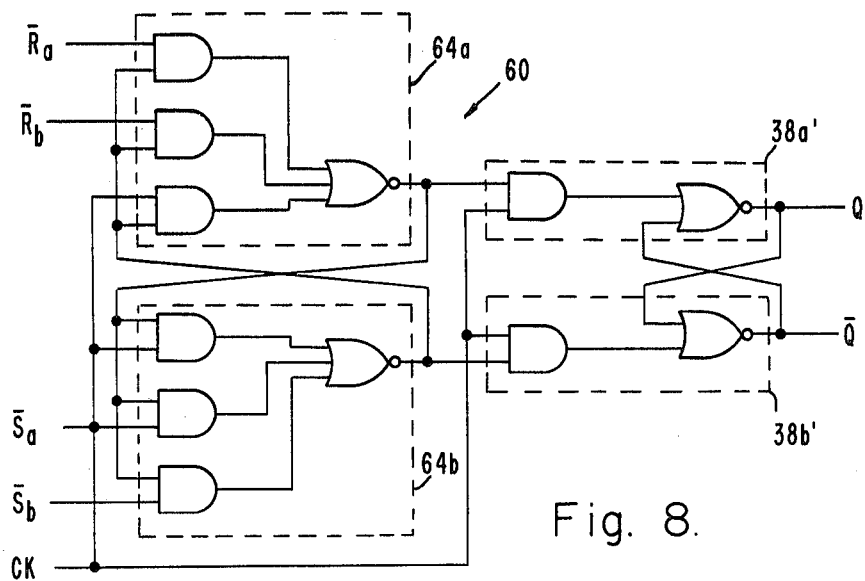
FIG. 8 is a logic diagram illustrating the first flip-flop of the counter of FIG. 7.

The logic gates in the feedback path of the dual modulus counter of this invention may be eliminated entirely by merging the function of the feedback logic gates 14, 16, 18 into the function of the first and last flip-flops 2 and 12. Such a merged counter is illustrated in the schematic diagram of FIG. 7 in which the first and last flip-flops 2, 12 are replaced by merged flip-flops 60 and 62 respectively. FIG. 8 is a logic diagram corresponding to the merged flip-flop 60 and FIG. 10 is a logic diagram corresponding to the merged flip-flop 62.

Figure 9A:
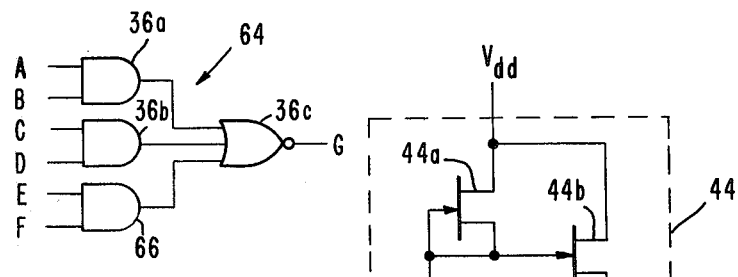
FIG. 9a is a logic diagram illustrating an AND/NOR gate used in the flip-flop of FIG. 8.
Figure 9B:
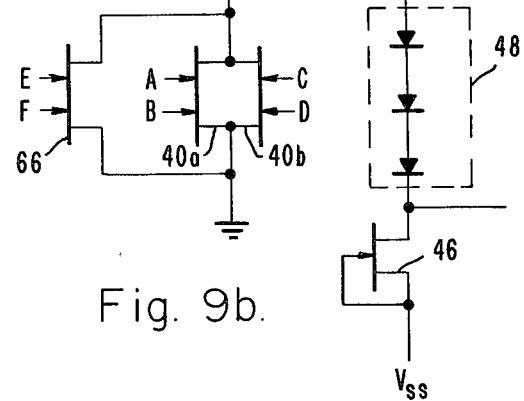

The merged flip-flop 60 illustrated in FIG. 8 includes two AND/NOR gates 64a, 64b of the type illustrated in the logic diagram of FIG. 9a. A suggested circuit implementation using gallium arsenide depletion mode field effect transistors is illustrated in the schematic diagram of FIG. 9b and is the same as the AND/NOR gate of FIG. 4b except that an additional dual-gate field effect transistor 66 is connected in parallel with the original dual-gate field effect transistors 40a and 40b. The flip-flop 60 illustrated in FIG. 8 also includes two AND/NOR gates 38a', 38b' which are of the same type as illustrated in FIG. 5a corresponding to the circuit implementation illustrated in FIG. 5b.

Figure 4A:
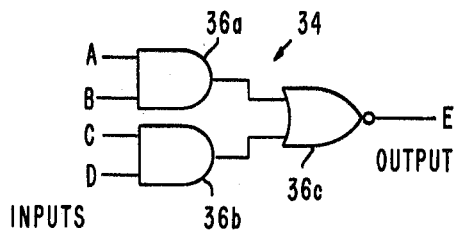

The flip-flop 62 illustrated in FIG. 10 includes two AND/NOR gates 34c, 34d of the same type as illustrated in FIG. 4a corresponding to the circuit implementation illustrated in the schematic diagram of FIG. 4b. The flip-flop 62 illustrated in FIG. 10 also includes two AND/NOR gates 38a'', 38'' corresponding to the two AND/NOR gates 38a' and 38' of FIG. 8. In addition, the flip-flop 62 of FIG. 10 includes an AND/NOR gate 70 corresponding to the logic diagram of FIG. 11a, including a NOR gate 72 and an AND gate 74. The preferred implementation of the AND/NOR gate 70 of FIG. 11a is illustrated in FIG. 11b and is identical to the circuit implementation illustrated in FIG. 5b except that an additional field effect transistor 76 is connected in parallel with the original transistors 40a, 40c.

The advantage of merging the feedback gates 14, 16, 18 into the first and last flip-flops 60, 62 is that, not only is the delay in the feedback to the first flip-flop 60 reduced in the merged counter of FIG. 7, but it is believed that such a device is easier to design. Therefore, the merged dual modulus counter of FIG. 7 is the preferred embodiment of the 10/11 counter of this invention.

Figure 12:
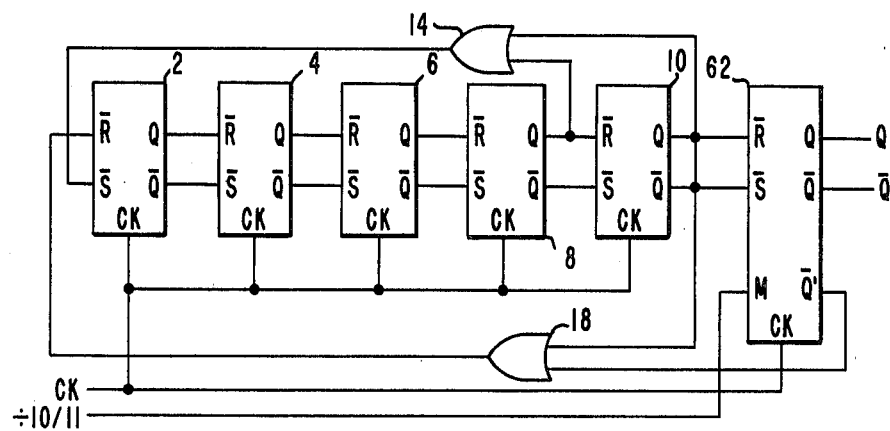

It may be desirable in some circumstances to substitute a partially merged counter of the type illustrated in FIG. 12 which includes each of the flip-flops 2, 4, 6, 8, 10 described previously, while the merged flip-flop 62 is substituted for the original flip-flop 12. The OR gates 14, 18 are of identical construction corresponding to the implementation illustrated in FIGS. 1d and 1d.

GENUS OF RING COUNTERS HAVING NON-INVERTING FEEDBACK

The counter of this invention is not confined to the 10/11 dual modulus species of the type illustrated in FIG. 1a or FIG. 7. Generally, by varying the total number of flip-flops in the ring counter, a counter of any modulus or dual modulus may be constructed using non-inverting feedback in accordance with the present invention. Advantageously, this invention includes a genus of an undetermined number of counters which exhibit the following characteristics in common:

(a) they are ring counters;
(b) they operate with a clock period of four gate delays;
(c) they do not require complementary clocks;
(d) they utilize master-slave flip-flops;
(e) they can tolerate one gate delay in each feedback path;
(f) they are self-initializing;
(g) They use non-inverting feedback; and
(h) The required feedback can be merged into the master of the first flip-flop of the counter and into the slave of the last one or two or more flip-flops of the counter.

Figure 13:
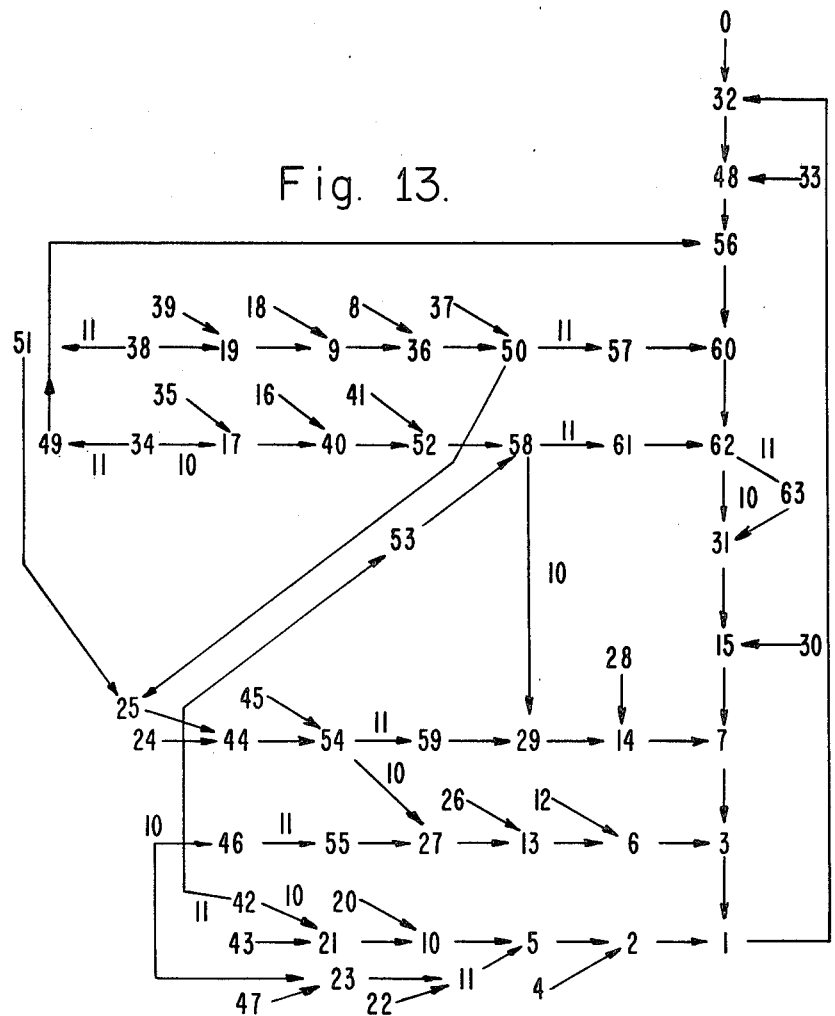
FIG. 13 is a state diagram corresponding to the counter of FIG. 1a and illustrating the self-initialization feature of that counter.

The foregoing characteristics have been discussed previously in some detail except the characteristic of subparagraph (f) above, namely the self-initialization feature. Advantageously, the counter of this genus does not require any separate initialization circuitry. Thus, although it is impossible to predict exactly what state the counter will assume when it is first powered up and begins counting, the counter will eventually enter into a logical loop in which it counts in its selected modulus. For example, FIG. 13 illustrates the state diagram corresponding to the 10/11 counter of FIG. 1a. The numbers represented in FIG. 13 are the base ten values corresponding to the binary states of each of the flip-flops 2 through 12 of FIG. 1a expressed in powers of two increasing from right to left. FIG. 13 shows that, no matter what state the counter is powered up in, it will eventually become initialized at 1 and will then begin counting by a modulus of 10 or 11, depending upon the logic state on the mode line 20.

Figure 14:
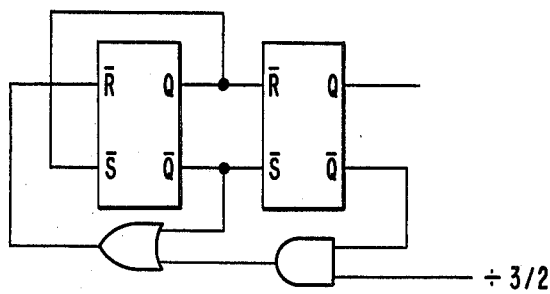
FIG. 14 is a simplified diagram of a 3/2 dual modulus counter, in accordance with the invention.
Figure 15:
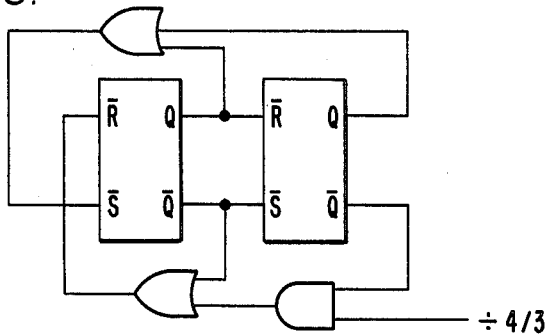
FIG. 15 is a simplified diagram of 4/3 dual modulus counter, in accordance with the invention.
Figure 16:
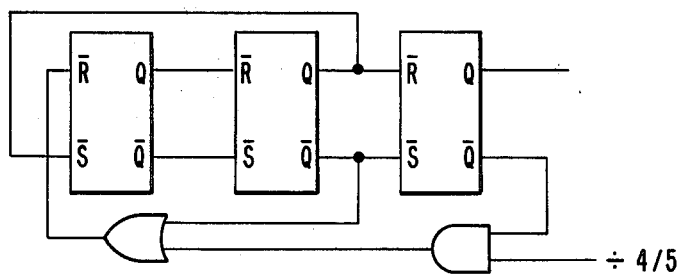
FIG. 16 is a simplified diagram of a 4/5 dual modulus counter, in accordance with the invention.
Figure 17:
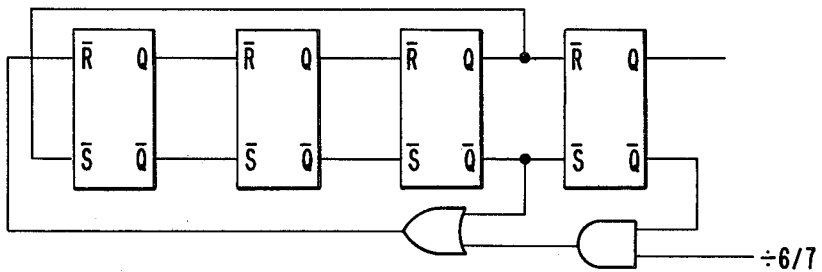
FIG. 17 is a simplified diagram of a 6/7 dual modulus counter, in accordance with the invention.
Figure 18:
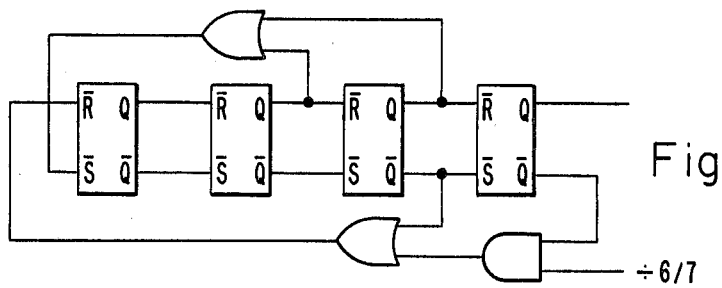
FIG. 18 illustrates an alternative embodiment of the 6/7 dual modulus of FIG. 17.
Figure 19:
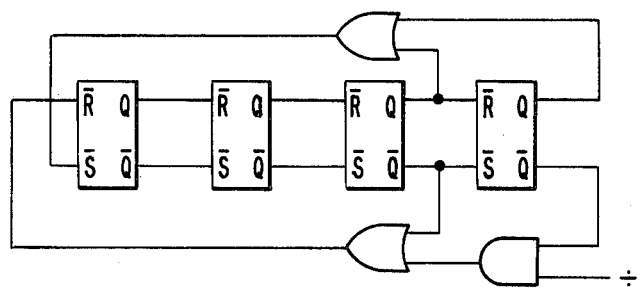
FIG. 19 is a simplified diagram of a ⅞ dual modulus counter, in accordance with the invention.
Figure 20:
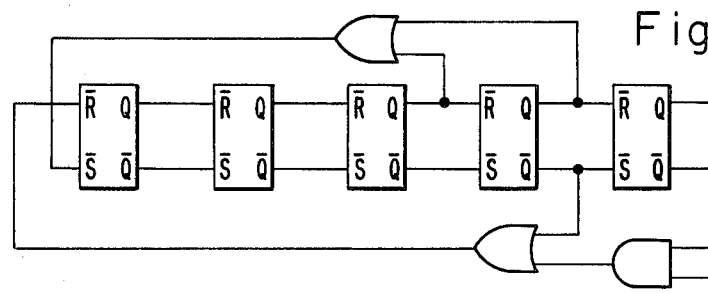
FIG. 20 is a simplified diagram of an 8/9 dual modulus counter, in accordance with the invention.
Figure 21:
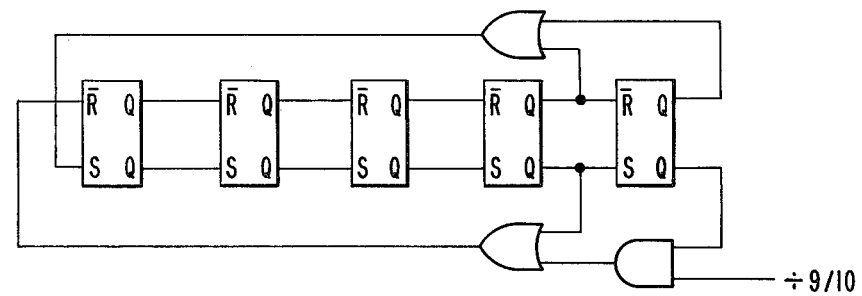
FIG. 21 is a simplified diagram of a 9/10 dual modulus counter in accordance with the invention.

All of the foregoing characteristics are shared by an undetermined number of dual modulus counters, some of which are illustrated by way of example in FIGS. 14 through 22. FIG. 14 illustrates a dual modulus 3/2 counter of the genus described above. FIG. 15 illustrates a dual modulus 4/3 counter of this genus. FIG. 16 illustrates a dual modulus 4/5 counter of this genus. FIG. 17 illustrates a dual modulus 6/7 counter of this genus and FIG. 18 illustrates an alternative embodiment of the dual modulus 6/7 counter FIG. 17. FIG. 19 illustrates a dual modulus 7/8 counter of this genus. FIG. 20 illustrates a dual modulus 8/9 counter of this genus. FIG. 21 illustrates a dual modulus 9/10 of this genus. In the embodiments illustrated in these latter figures, and in other embodiments not shown, it should be understood that the feedback logic gates 14, 16, 18 may have their functions merged into one or more of the first and last flip-flops of each of the counters in the manner described previously in connection with the merged counter of FIG. 7.

Figure 22:
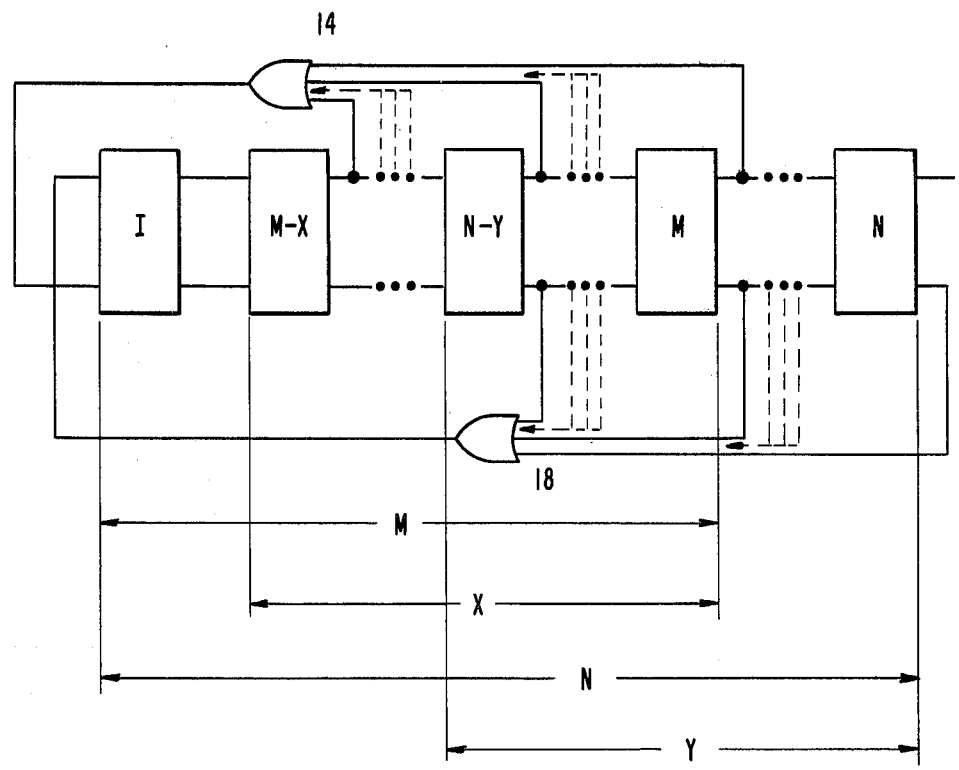
FIG. 22 is a schematic diagram illustrating a generalized counter in accordance with the invention.

FIG. 22 illustrates a generalized counter of this genus using any number of flip-flops 1 through N and having non-inverting feedback through the OR gates 14 and 18 of the type discussed previously in connection with FIG. 1a. The logic gates required for the dual modulus capability are not illustrated in FIG. 22 for the sake of simplicity. The feedback through the OR gate 14 is generally derived from the output of any one of the flip-flops between the $(m-x)^{th}$ flip-flop and the $m^{th}$ flip-flop. The feedback through the OR gate 18 is generally derived from the output of any one of the flip-flops between the $(m-y)^{th}$ flip-flop and the $m^{th}$ flip-flop. An undetermined number of counters may be realized using the format of FIG. 22 and are self-initializing if the following inequality is obeyed in constructing the counter:

$$3x > 2m - n.$$

Other variations within this subgenus may be achieved by selecting all the 1 through N flip-flops to be of the type illustrated in FIG. 3 or by substituting one or the other of the merged flip-flop 60, 62 of the type illustrated in FIGS. 8 and 10, respectively, for the first and last flip-flops 1 and N, respectively, to eliminate the feedback OR gates 14, 18.

Other species may be made by exchanging the positions of the master and slave portions the flip-flops 2 through 12 and of the merged flip-flops 60, 62. In order to implement these latter species, some obvious design modifications must be made in the flip-flops and in the feedback logic, which would be apparent to the skilled worker, and, therefore, will not be discussed here. Another variation within the genus of this invention may be made by exchanging the logic functions as follows:

All AND gates are replaced by OR gates and all NOR gates are replaced by NAND gates. A further subspecies of this latter variation may be realized by exchanging the position of the master and slave of each of the flip-flops. It is contemplated that a skilled worker may generate other variations not expressly called for in this specification without departing from the scope of the invention.

What is claimed is:

1. A self-initializing ring counter, comprising:
   (A) means for receiving a clock signal;
   (B) a plurality of n flip-flops, each of said flip-flops, comprising:
      (1) a master and a slave each having its own clock input, the clock inputs of both being connected to receive the same clock signal, said master and slave being enabled by said clock signal at different times, and
      (2) an $\bar{R}$ input, an $\bar{S}$ input, a Q output and a $\bar{Q}$ output;
   (C) said plurality of said n flip-flops being connected in serial succession, whereby the Q and $\bar{Q}$ outputs of each flip-flop are connected to the $\bar{R}$ and $\bar{S}$ inputs respectively, of the next successive flip-flop; and
   (D) said counter having a non-inverting feedback, comprising:
      (1) first means coupling the Q outputs of the $(n-1)^{th}$ flip-flop and $(n-2)^{th}$ flip-flop to the $\bar{S}$ input of the $(1)^{st}$ flip-flop, and
      (2) second means coupling the $\bar{Q}$ outputs of the $(n-1)^{th}$ flip-flop and the $(n)^{th}$ flip-flop to the $\bar{R}$ input of the $(1)^{st}$ flip-flop.

2. The counter of claim 1 wherein said first coupling means comprises a first logic gate connected in serial fashion between said Q outputs of said $(n-2)^{th}$ flip-flop and $(n-1)^{th}$ flip-flop and said $\bar{S}$ input of said $(1)^{st}$ flip-flop.

3. The counter of claim 1 wherein said first coupling means comprises logic elements merged into said $(1)^{st}$ flip-flop, said merged logic elements being connected in parallel fashion with at least some logic elements in said $(1)^{st}$ flip-flop, and said merged logic elements comprising inputs connected to said Q outputs of said $(n-2)^{th}$ flip-flop and $(n-1)^{th}$ flip-flop.

4. The counter of claim 1 wherein said second coupling means comprises a second logic gate coupled in serial fashion between said $\bar{Q}$ outputs of said $(n-1)^{th}$ flip-flop and $(n)^{th}$ flip-flop and said $\bar{R}$ input of said $(1)^{st}$ flip-flop.

5. The counter of claim 1 wherein said second coupling means comprises other logic elements merged into said $(1)^{st}$ flip-flop and connected in parallel fashion with at least some other logic elements in said $(1)^{st}$ flip-flop, said other merged logic elements comprising logic inputs coupled to said $\bar{Q}$ outputs of said $(n-1)^{th}$ and $(n)^{th}$ flip-flop.

6. The counter of claim 1 further comprising dual modulus control means connected as an input to said second coupling means for causing said counter to reach a terminal count of one of two selectable integers.

7. The counter of claim 6 wherein said dual modulus control means comprises a third logic gate connected between said $\bar{Q}$ output of said $(n)^{th}$ flip-flop and said second logic gate, said third logic gate having one of its inputs available for selecting one of said two integers for said terminal count.

8. The counter of claim 6 wherein said dual modulus control means comprises a logic gate merged into said $(n)^{th}$ flip-flop and connected in parallel fashion with other logic gates in said $(n)^{th}$ flip-flop, said merged logic gate including an input available for controllably selecting one of said two integers for said terminal count.

9. The counter of claims 1, 2, 3, 4, 5, 6, 7 or 8 wherein n is equal to one of 2, 3, 4, 5 and 6.

10. The counter of claims 6, 7 or 8 wherein said two selectable integers are members of a group comprising the following pairs: 3, 2; 4, 3; 4, 5; 6, 7; 7, 8; 8, 9; 9.

11. The counter of claim 1 wherein said n flip-flops are implemented using AND/NOR logic comprising gallium arsenide depletion mode field effect transistors.

* * * * *

UNITED STATES PATENT AND TRADEMARK OFFICE
CERTIFICATE OF CORRECTION

PATENT NO. : 4,394,769
DATED : July 19, 1983
INVENTOR(S) : John M. Lull

It is certified that error appears in the above—identified patent and that said Letters Patent is hereby corrected as shown below:

Column 1, after the Title, please insert the following paragraph:

> "The government has rights in this invention pursuant to contract no. DAAB07-78-C-2998 awarded by the Department of the Army."

Signed and Sealed this

Second Day of April 1985

[SEAL]

Attest:

DONALD J. QUIGG

Attesting Officer     Acting Commissioner of Patents and Trademarks